United States Patent [19]
Eaton, Jr.

[11] Patent Number: 5,253,205
[45] Date of Patent: Oct. 12, 1993

[54] BIT LINE AND CELL PLATE CLAMP CIRCUIT FOR A DRAM

[75] Inventor: S. Sheffield Eaton, Jr., Colorado Springs, Colo.

[73] Assignees: Nippon Steel Semiconductor Corporation, Chiba, Japan; United Memories, Inc., Colorado Springs, Colo.

[21] Appl. No.: 755,111

[22] Filed: Sep. 5, 1991

[51] Int. Cl.⁵ .................................................. G11C 7/00
[52] U.S. Cl. ........................... 365/189.06; 365/189.09; 365/149; 365/203
[58] Field of Search ...................... 365/189.06, 189.09, 365/189.11, 203, 149

[56] References Cited

U.S. PATENT DOCUMENTS

| | | | |
|---|---|---|---|
| 4,491,936 | 1/1985 | Eaton, Jr. et al. | 365/149 |
| 4,799,193 | 1/1989 | Horiguchi et al. | 365/149 |
| 4,965,769 | 10/1990 | Etoh et al. | 365/149 X |

Primary Examiner—Joseph A. Popek
Attorney, Agent, or Firm—Edward D. Manzo

[57] ABSTRACT

A supply circuit providing an intermediate voltage between Vss and Vcc for a DRAM is coupled to both the cell capacitor plates and the bit line clamp transistors. The supply circuit includes a logic circuit which ANDs the equilibration signal and a restore complete signal thereby to provide a timing signal in the initial portion of the precharge epoch. The timing signal turns on first and second transistors which operate as a load to develop a voltage at first and second nodes. The voltage so developed is a transition voltage above the target holding voltage. This voltage is stored on a storage capacitor, and to the gate electrode of a drive transistor and a third transistor. The drive transistor selectively couples operating voltage to the hold line. After the logic circuit turns off, the offset voltage which has been stored on the capacitor controls the drive transistor to couple the target holding voltage to the holding line.

48 Claims, 4 Drawing Sheets

BIT LINE AND CELL PLATE CLAMP CIRCUIT FOR A DRAM

FIELD OF THE INVENTION

The present invention relates to circuits by which voltage is supplied or applied in dynamic random access memories (DRAMs), and particularly relates to (1) the bit line clamping circuit of a semiconductor memory involving the precharge or equilibration of the bit lines, and (2) a supply circuit coupled to supply an intermediate voltage supply to the capacitor plates of DRAM memory cells.

BACKGROUND OF THE INVENTION

This invention is directed to DRAMs but can find application in static RAMs and other semiconductor memories as well, and other integrated circuits which have an array of memory cells disposed along orthogonal directions in a reticulated fashion, often in collections of sub-arrays. Generally, the cells are along columns defined by bit lines which are orthogonal to word lines. See, for example, Eaton, Jr. et al. U.S. Pat. No. 4,389,715 entitled "Redundancy Scheme For A Dynamic RAM" for a general description of a DRAM, and Sud, Hardee, & Heightley U.S. Pat. No. 4,355,377 entitled "Asynchronously Equilibrated and Pre-Charged Static RAM" for a general description of a SRAM.

In such memories, attention is given to the equilibration and precharging circuitry, as in Hardee et al. U.S. Pat. No. 4,494,221 entitled "Bit Line Precharging and Equilibrating Circuit."

Reference is made to FIG. 1 which is a set of representative signals that are common in DRAMS of today's genre. The top waveform illustrates the row address strobe inverse signal called RAS BAR. When RAS BAR is low, the memory is in the active period, but when RAS BAR is high, the memory is in the precharge epoch. The memory alternates between such epochs many times per second. As is well known, DRAMs are volatile and dynamic; that is, typically the data is stored in the form a small amount of charge on a capacitor. This charge leaks away through any of a variety of mechanisms, whereupon the data becomes lost. To prevent this catastrophic result, the memory cell containing the capacitor is repeatedly read and refreshed. When it is read, a sense amplifier operates to determine what datum has been stored in the cell, and rewrites that datum in the cell. Without reading and refreshing, the data will be lost.

The sense amplifier is generally coupled to one or a pair of bit lines which are sometimes referred to as the bit line and bit bar line. In some memories, especially SRAMs, complementary states of the data are stored in the memory cell or in a complementary pair of memory cells. Whether or not such complementary data is stored, the sensing operation, which is used during the refresh operation, involves setting the bit line which is connected to the memory cell to be refreshed to a known value. This value is commonly referred to as the "precharge voltage" or the "equilibrate voltage." The equilibrate voltage causes the bit line to be precharged, and the second waveform in FIG. 1 illustrates the equilibrate voltage or signal which may be called $\phi_{EQ}$. It will be seen that $\phi_{EQ}$ is shifted slightly to the right with respect to RAS BAR; soon after RAS BAR drops low, $\phi_{EQ}$ drops low. Also, a few nanoseconds after RAS BAR rises to the high state (Vcc), denoting the beginning of the precharge epoch, $\phi_{EQ}$ likewise rises, typically to the power supply voltage Vcc.

The restoration period normally takes several nanoseconds, and the third waveform in FIG. 1 is $\phi_{RC}$. It will be observed that the trailing edge of $\phi_{RC}$ occurs approximately or, nominally 10 nanoseconds after the rising edge of $\phi_{EQ}$.

Circuits for precharging and equilibrating the bit lines are well known. FIG. 2 represents a prior art approach in a simplified portion of a DRAM array. One column includes a bit line 10a paired with a bit bar line 11a. Each of them is connected via a respective fuse 12a, 13a to a sense amplifier 14a. Along each bit line may be positioned a plurality of memory cells 15M, and, in a DRAM, a dummy cell 15D for each bit line, coupled to the sense amplifier via fuses 12, 13. Each memory cell 15M illustratively comprises a transistor and a capacitor. One plate of the capacitor is coupled to Vss. The other plate is coupled to the bit line via the transistor, which has a path of controllable conductivity controlled by a voltage on a word line WL. The word lines WL-1 to WL-N make up N rows of the array, and, as seen in FIG. 2, are orthogonal to the column (bit) lines 10, 11. A respective dummy memory cell 15D is included in each column, and is controlled by a dummy word line WL-D. The dummy cell has a capacitance that may be equal to, larger than, or smaller than that capacitance of each memory cells 15M.

An equilibration transistor 16a has a source-drain path which couples bit lines 10a, 11a together whenever the transistor is turned on. The gate electrode of transistor 16a is coupled to receive the equilibration signal $\phi_{EQ}$ of FIG. 1.

Beside transistor 16a are "keeper transistors" 18a and 20a. Transistor 18a has its source-drain path coupled between a line 22 and bit line 10a. Keeper transistor 20a has its source-drain path coupled between line 22 and bit line 11a. The gate electrodes of transistors 18 and 20 are also coupled to receive the equilibration signal $\phi_{EQ}$. In this instance where transistor 16, 18 and 20 are n-channel transistors which turn on upon the application of a relatively positive voltage for $\phi_{EQ}$, it being understood that other types of switching devices could be used, the transistors upon application of the equilibration signal $\phi_{EQ}$ equilibrate or equalize the voltages on bit lines 10a and 11a, and couple those bit lines also to receive whatever voltage is applied via line 22.

The column circuitry of FIG. 2 comprising 10a, 11a, 12a, 13a, 14a, 16a, 18a, and 20a can be referred to as columns A and A*. Further columns B and B* with identical construction are located parallel to A and A*. Indeed, a plurality of such like columns collected together in a memory chip form an array or sub-array.

One modification of this prior art approach is shown in Hardee, U.S. Pat. No. 4,791,613 entitled "Bit Line And Column Circuitry Used In A Semiconductor Memory." It uses a different voltage for the equilibration signal applied to the equilibration transistor, and applies the power supply voltage Vcc to the "keeper transistors" 18, 20.

In the prior art, originally bit lines were set to either zero volts or to the power supply voltage Vcc during the precharge or equilibrate operation. Newer DRAMS precharge the bit lines to ½ Vcc. To achieve this precharge voltage, the bit and bit bar lines are typically shorted together at the beginning of the precharge cycle. (One bit line has a Vcc level and the other has a Vss level. When shorted, ½ Vcc results.) To maintain this voltage, a voltage divider 24 can be formed from a pair of resistors, or transistors being used as resistors, coupled between Vcc and ground as illustrated in FIG. 2. The voltage obtained from the divider is then applied via line 22 to hold the bit lines near to the desired precharge value.

One problem is that today's memories are so large in capacity (have so many memory cells) that a separate power supply voltage could be entertained to maintain the precharge voltage that is applied from line 22 via transistors 18, 20 to the bit lines. However, such an approach is undesirable, as industry does not want to add a separate power supply voltage or an additional pin to carry that precharge voltage.

A problem with precharging the bit lines to some voltage intermediate zero volts and Vcc without a separate power supply for the intermediate voltage is that the precharge voltage has a tendency to leak away during the refresh epoch and cannot be maintained in the event of a shorted bit line. If the precharge voltage does manage to dissipate entirely, the data will essentially be lost because the cell cannot be read by the sense amplifier circuit.

Notice in FIG. 2 that when, during precharge, transistors 16, 18, and 20 are turned on, all of the bit lines are coupled together via line 22. Hence, a large number of bit lines are ganged together during the precharge operation. One problem is that even one bad bit line will ruin the entire memory. If the bit line constantly draws current through a short, the precharge supply from voltage divider 24 will simply be unable to overcome the short, and the entire memory will be inoperative.

To avoid this catastrophic result, fuses 12 and 13 are employed along With testing procedures to identify all such shorted bit lines. The bad bit lines can then be isolated from the circuit by blowing the appropriate fuse 12 (and redundant bit lines can be substituted). This remedy, however, involves the addition of the fuses and the further test procedures which drive up the cost of the memory.

One object of the present invention, accordingly, is to avoid the problem of one bad memory cell or bad bit line spoiling the entire memory.

Another object is to cure the problem of bad bit lines without adding bit line fuses or the like.

A further object of the invention is to eliminate the voltage divider used in the prior art to provide the "hold" or precharge voltage.

Another object of the present invention is to decrease substantially the high standby current exhibited by the prior art.

A worthy object of this invention is to provide a way to hold the bit lines more closely to the desired precharge voltage for an extended duration and with good control over the voltage.

As mentioned supra, the memory cells in the DRAM have a capacitor plate that in the past has been coupled to ground. Current trends are to couple those cell capacitor plates to Vcc/2, which enables the cell capacitor dielectric to be made thin. That is, one-half of the electric field (which normally causes breakdown) can be used. Thus, the prior art may couple the cell capacitor plates to either Vss, Vcc/2, or even Vcc. A typical Vcc/2 circuit is depicted in FIG. 3. FIG. 3 shows a four transistor power supply circuit having a first n-channel transistor 26 having a source-drain path coupled in series with the source-drain path of a first p-channel transistor 28. The drain of transistor 26 is coupled to Vcc, the source of transistor 26 is coupled to an output node 30, node 30 is coupled to the source of transistor 28 and the drain of transistor 28 is coupled to ground. A second n-channel transistor 40 has its source-drain path coupled in series with the source-drain path of a second p-channel transistor 32. Thus, a node 34 is coupled via a resistor 36 to a source of operating voltage, Vcc. Node 34 is coupled to the gate electrode and the drain of n-channel transistor 30. The source of transistor 40 is coupled to the source electrode of p-channel transistor 32. The drain of transistor 32 is coupled to ground (Vss) via a resistor 38 with a node 39 therebetween. It will be understood that the voltage developed at node 34 is ½ Vcc+Vtn. The voltage developed at node 39 is ½ Vcc−Vtp, where Vtn is an n-channel threshold voltage, and Vtp is a p-channel threshold voltage. The voltage developed at output node 30 is ½ Vcc.

The typical ½ Vcc circuit, such as that of FIG. 3, draws considerable standby current when coupled to the cell capacitor plates. Ideally, the ½ Vcc supply would be provided by a separate low-impedance power supply to prevent plate bounce, but the extra pin for the integrated circuit chip is undesirable. Also, it is nearly impossible to design a low-impedance intermediate value power supply "on chip" while drawing very little current from the main supplies.

Accordingly, a further object of the present invention is to overcome this problem of providing an intermediate voltage to the capacitor plates of the memory cells while controlling the standby current used in that operation.

SUMMARY OF THE INVENTION

A DRAM constructed according to the present invention does not require a voltage divider coupled to a holding node which is then coupled to keeper transistors. Rather, a device constructed according to the present invention uses a new circuit coupled to a holding line. According to a further aspect of the invention, the holding line is coupled also to the cell capacitor plates.

The invented circuit and method generate a voltage that is a function of the target holding voltage. The "holding voltage" or "target holding voltage" means the voltage at which we desire the bit lines to be held as a result of the precharge/equilibrate operation. Preferably the voltage that is generated is simply offset from the target holding voltage by one threshold voltage transition, then held on a capacitor and later used to maintain the bit line equilibration voltage at precisely the desired holding voltage.

Preferably, logic signals are used to determine an interval during an initial portion of the precharge epoch. During that interval, transistors are turned on to generate the desired holding voltage on the holding line. Preferably this involves producing a voltage at an internal node of the circuit which is one transition voltage above the target holding voltage, and then dropping that voltage by one transition voltage in applying it to the holding line coupled to the bit lines via keeper transistors. Meanwhile, the voltage from the internal node is also stored on the capacitor.

Preferably, the capacitor and transistors are coupled in a manner to minimize the time decay of the voltage stored on the capacitor. This is achieved in the preferred embodiment by making the capacitor fairly large and by maximizing the ratio of the capacitance to the junction area on the transistor(s) to which the capacitor is coupled in the new circuit.

The voltage on the storage capacitor persists even after the logic signals have concluded so that during the remainder of the precharge epoch, a large drive transistor is controlled by the stored voltage. The drive transistor is coupled between the power supply and the holding line and thereby to the bit lines. Because of its large size, any shorts in an individual bit line, or in a number of the bit lines, will not pull the precharge voltage down to zero for all bit lines, but will be a relatively insignificant disturbance, whereby the short in a limited number of bit lines can be tolerated.

Moreover, the precharge voltage persists for a long duration, much longer than the refresh times normally specified for a DRAM. An aspect of the invention is that the internal node where the offset voltage is developed is decoupled from the bit lines. Alternatively, the internal node need not be permanently coupled to the capacitor, but could be selectively coupled to it so that in some manner, the voltage stored on the capacitor is preserved by decoupling the capacitor from the hold line and from other routes by which the stored charge can dissipate.

BRIEF DESCRIPTION OF THE DRAWINGS

In describing a preferred embodiment of the present invention, reference is made to the accompanying drawings in which.

DESCRIPTION OF A PREFERRED EMBODIMENT

Figure 2:
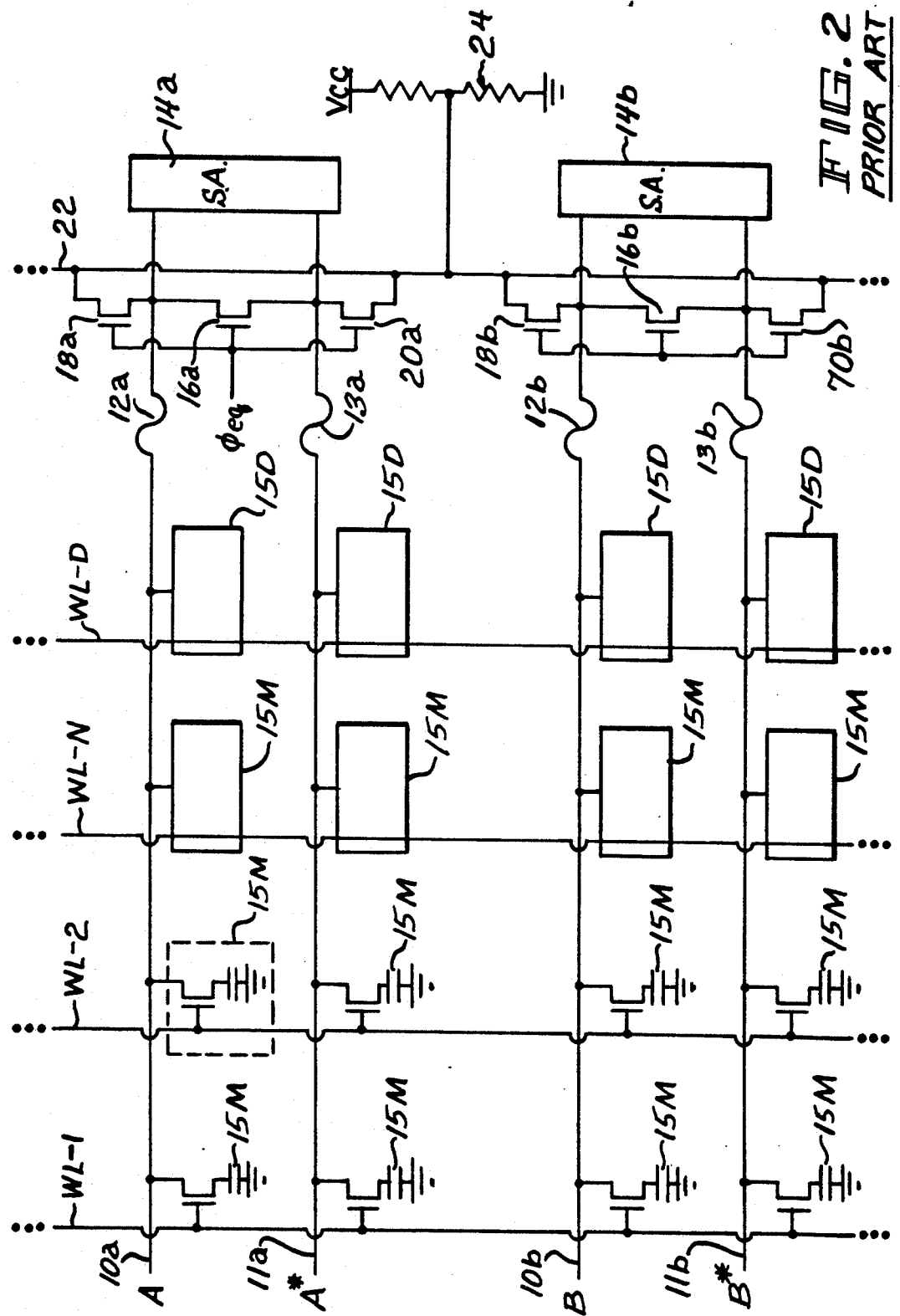
FIG. 2 depicts a portion of a DRAM in current use, particularly illustrating the relationship of the voltage divider used to keep the bit lines precharged to a target voltage.
Figure 4:
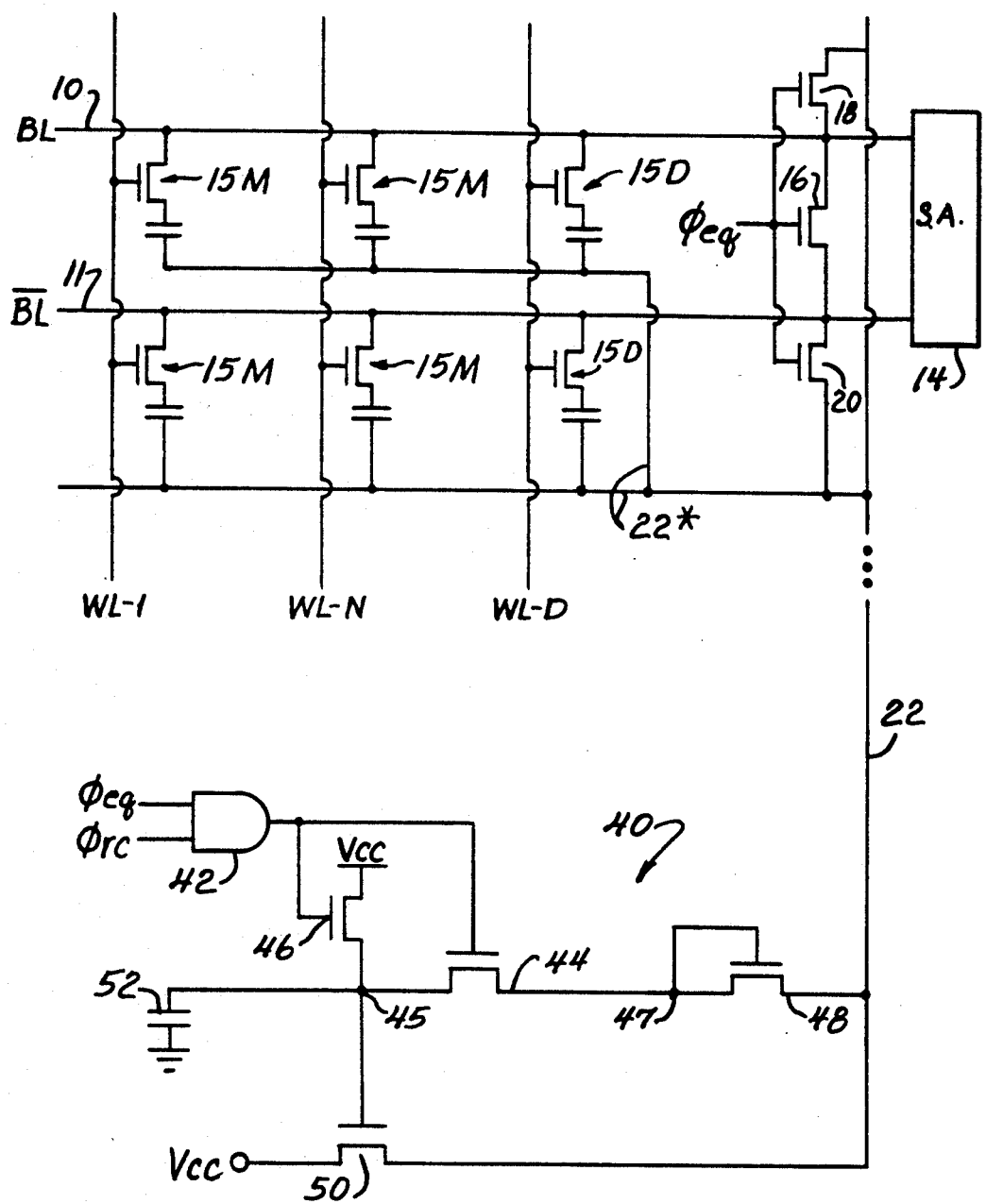
FIG. 4 represents a circuit according to the preferred embodiment of the present invention.

A circuit in accordance with some teachings of the present invention is illustrated in FIG. 4 which is similar in man respects to FIG. 2. Like parts have like reference numerals. Thus, in both the prior art configuration and in the present configuration, a pair of bit lines 10, 11, with a sense amplifier 14 coupled thereto is configured with equilibration transistor 16 and transistors 18 and 20, as described above in respect of FIG. 2. The equilibration signal $\phi_{EQ}$ is applied to the gate electrodes of these equilibration and keeper transistors. A plurality of memory cells is coupled to each of the bit lines 10, 11. Dummy cells also may be coupled to the bit lines 10, 11. For convenience, only one pair of bit lines has been shown, but it will be understood that an entire array having plural bit line pairs is intended but not illustrated. Also it will be understood that appropriate decoders for columns and rows are to be included, as are I/0 buffers, data buffers, and other peripheral circuitry common to DRAMs, as in USPN 4,389,715.

The keeper transistors are coupled to a line (node 22) which in the circuit of FIG. 2 was coupled to a voltage divider but which in the embodiment illustrated in FIG. 4 is applied to a new circuit 40. The voltage which is impressed or applied by circuit 40 onto line 22 may be referred to as the "hold voltage" $V_h$.

Prior to describing supply circuit 40, it should be noted that in the circuit of FIG. 4, line 22 is coupled to the cell capacitor plates, as well as to transistors 18, 20. Thus, lines 22* are coupled to line 22 and ar coupled to the bottom capacitor plates of all the memory cells. It will be appreciated that lines 22* may be laid out parallel to the bit lines, or parallel to the word lines. Modification is possible in that a first line 22* may be connected to all of the bottom capacitor plates in one or more rows of memory cells, or, alternatively, to the bottom capacitor plates in one or more columns. It is noteworthy that the cell capacitor plate electrodes are coupled to the keeper transistors, which is a feature of the present invention. That is to say, providing a supply circuit 40 coupled to a line 22 which provides power to both the cell capacitor plates and to the bit lines is one of the aspects of the present invention. Likewise, the skilled artisan will recognize that according to another feature of the invention, the capacitor plates may be coupled to circuit 40 without coupling circuit 40 to the bit lines. Alternatively, the circuit 40 may be coupled to the bit lines without coupling it to the capacitor plates. However, in the preferred embodiment, circuit 40 is coupled to both the bit lines and to the cell capacitor plates.

An advantage of this new approach is that the bit line and capacitor plate voltages are "equilibrated" or brought to the same potential. Usually the voltage margin for reading a "one" or a "zero" changes with the value of Vcc. That is, if a "one" is written at a low Vcc and read at a high Vcc, there is less margin for reading the "one", since at the higher Vcc value, the bit line equilibrate voltage moves up, thus decreasing the differential voltage between the memory cell "one" and the bit line voltage. This results in loss of signal. According to this aspect of the present invention, when the plate voltage moves up with Vcc, it kicks up the cell voltage by the same amount, thereby keeping the cell/bit line voltage and the signal constant. In prior art circuitry, which keeps current as low as possible, it takes time for this to happen. That is, the plate voltage may not follow Vcc changes in real time. Also, there is no mechanism in the prior art for plate and bit line voltages to be equal. Thus, an important advantage of equalizing the voltages as done in FIG. 4 is that more consistent signal levels are obtained over a wider range of Vcc levels.

The skilled artisan will appreciate that in this configuration, the bit line capacitance is being used to establish a low impedance plate voltage. Thus, capacitive divider current is used to effectively obtain a low impedance plate supply without the necessity of adding an external supply and its associated pin.

Figure 1:
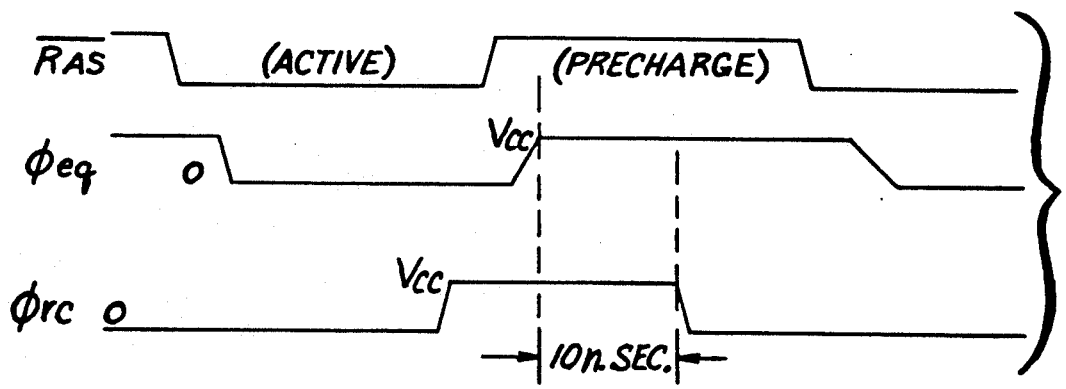
FIG. 1 is a set of waveforms showing various signals used commonly in modern DRAMS.
Figure 3:
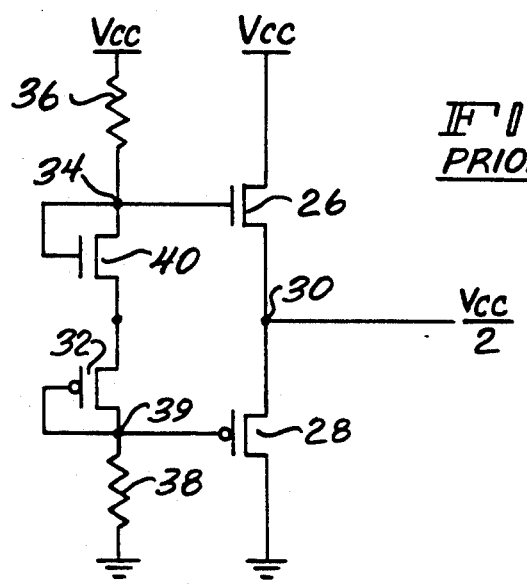
FIG. 3 shows a prior art ½ Vcc voltage divider for all capacitor plates.

Turning now to a description of circuit 40 in FIG. 4, within circuit 40 is a logic circuit 42 taking the form illustratively of an AND gate which provides a signal during the precharge epoch. This is conveniently done by ANDing the signals $\phi_{EQ}$ and $\phi_{RC}$ which, as can be observed in FIG. 1, are commonly high for a duration of approximately 10 nanoseconds in an early or beginning portion of the precharge epoch. It will be understood that other logic circuits could be used in an application of the present invention to produce a signal which is high during an initial portion of the precharge epoch. Moreover, other circuit variations are possible which do not need to generate a separate timing signal.

In FIG. 4, first and second switching devices 44 and 46 are coupled together to have a first node 45 between paths of controllable conductivity of the devices, coupled in series. Illustratively, these transistors take the form of n-channel field effect transistors (FETs), although other types of controllable switching devices can be used. The drain electrode of FET 46 is coupled to a source of operating voltage (Vcc). The source electrode of FET 46 is coupled to first node 45, which is coupled to the source of FET 44. The drain of FET 44 is coupled to a second node 47, which is coupled to the source and the gate electrode of a third transistor 48.

The output of AND gate 42 is coupled to the control (gate) electrodes of FETs 44 and 46, and when the output of AND gate 42 goes high, it turns on these first and second transistors 44 and 46. The source-drain paths of transistors 44 and 46 couple first node 45 and second node 47 to Vcc. Transistors 44 and 46 form a load so that a voltage intermediate ground and Vcc develops at first and second nodes 45 and 47.

As mentioned, second node 47 is coupled to third transistor 48, illustratively an n-channel FET. By coupling node 47 to both the source and the gate electrode of FET 48, the drain voltage is one (n-channel) voltage transition $V_T$ below the source voltage. The drain of transistor 48 is coupled to the hold line 22.

I refer to the voltage resulting at line 22 (when FETs 44 and 46 are on) as the holding voltage $V_h$, or the target holding voltage. The voltage at nodes 45 and 47 will be the holding voltage plus one $V_T$.

The source-drain path of a further, large transistor 50 is coupled between Vcc and hold line 22. Its gate electrode is coupled to node 45. Illustratively, transistor 50 is a FET and may be referred to as a drive transistor. The voltage coupled via drive transistor 50 to hold line 22 is a function of the gate voltage, among other factors discussed infra.

Node 45 is coupled also to one plate of a capacitor 52. The other plate of capacitor 52 is coupled to ground so that capacitor 52, barring leakage, stores the voltage that appears at node 45.

In terms of the manner of operation of the circuit of FIG. 4, while transistors 44 and 46 are turned on, a voltage develops at node 45, as mentioned, which is one voltage transition above the hold voltage. This is sufficient to turn on n-channel drive transistor 50. (It will be understood that an n-channel FET is turned ON when its gate voltage is at least one $V_T$ higher than its source voltage. Here, the source voltage is, by definition, the holding voltage $V_h$. As explained above, the voltage developed on node 45 is exactly one $V_T$ above $V_h$. Therefore, transistor 50 is ON, and its source-drain path is conductive, so that the power supply voltage Vcc is coupled via transistor 50 to line 22.)

Hence, in the initial part of the precharge epoch, power is supplied via transistor 46 and via transistor 5 to the holding line or node 22 to precharge the bit lines. The voltage of node 45, which is one voltage transition above the holding voltage, is stored on capacitor 52.

The next event to occur is that the restore complete signal $\phi_{RC}$ drops low. This causes the logic gate 42 to output 0 volts, which is lower than the source voltages on transistors 44 and 46 which consequently turn off. When transistor 44 is off, the hold line, FET 48, and node 47 are decoupled from node 45. With transistor 46 turned off, Vcc is also decoupled from capacitor 52. The voltage at node 45, $V_h+V_T$, remains on capacitor 52 and continues to be supplied to the gate electrode of transistor 50.

It will be seen from FIG. 1 that the equilibrate signal $\phi_{EQ}$ remains high for the remainder of the precharge epoch, so that transistors 16, 18 and 20 associated with the bit lines remain turned on. The bit lines have a fair number of n+ junctions and diffusions and inherently leak quickly. However, as long as transistor 50 remains turned on, it will continue to supply precharge voltage through its source-drain path to node 22. Transistor 50 is constructed fairly large, illustratively having a width of 75 microns and a length of 1 micron, so that it can overcome a reasonable number of shorts in the bit lines.

The voltage applied to line 22 by transistor 50 alone, without transistors 44 and 46 being on, should preferably be the holding voltage, defined earlier. The present circuit continues to apply that very same voltage to line 22 even after logic gate 42 goes low. The voltage stored into capacitor 52 will remain on node 45, barring leakage. This voltage of node 45 is $V_h+V_T$. Whenever the voltage on line 22 drops below $V_h$, then transistor 50 turns on, because the gate voltage will be more than one $V_T$ above it. This couples Vcc to line 22 and the voltage thereon will begin to rise. Transistor 50 turns off when the voltage it impresses on line 22 rises above $V_h$—because the gate voltage is precisely $V_h+V_T$ and the gate voltage will no longer exceed the drain voltage by one $V_T$. Thus, by preserving (storing) a voltage that is $V_h+V_T$, isolating it from leakage, and applying it to the gate electrode of the drive transistor 50, line 22 is clamped to the holding voltage $V_h$ even after transistor 44 and transistor 46 turn off. This is the desired operation wherein the holding voltage is preserved throughout the precharge epoch.

To achieve this result, it is necessary that the voltage applied to the gate electrode of transistor 50 by capacitor 42 be well controlled. Leakage of that voltage would be disadvantageous. To control this, the circuit is designed so that capacitor 52 is coupled to only three places: the gate electrode (which does not draw current) of the drive transistor, and to source electrodes of transistors 44 and 46, both of which are turned off while the voltage on capacitor 52 is to be preserved (during the latter portion of the precharge epoch).

Figure 5:
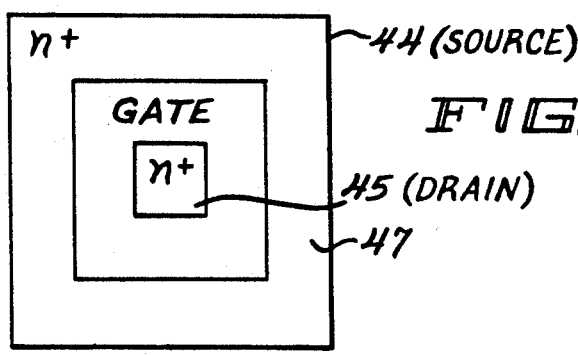
FIG. 5 illustrates the layout of on of the transistors in the improved circuit of FIG. 4.

Transistor 44 has a layout which minimizes its junction area, as illustrated in FIG. 5. It thereby maximizes the ratio of the capacitance 52 to the junction area of transistor 44. This is done illustratively by a square layout. Capacitor 52 may illustratively have 10 picofarads. There may be about 1 square micron of junction area on transistor 44. This will allow a substantial time interval before the voltage on capacitor 52 leaks away to the substrate through the junction of transistor 44. Accordingly, the voltage on capacitor 52 is conserved, remaining high through the precharge period to control the gate voltage at transistor 50. Transistor 46 can be similarly constructed.

It will be appreciated that transistor 50 is huge in comparison to the size of any of the keeper transistors 18 or 20, so that even if there is a short on the bit line corresponding to one of the keeper transistors, there will be little damage by virtue of that short being coupled via the corresponding keeper transistor to node or line 22.

Various departures can be made from the preferred embodiment of FIG. 4 without departing from the scope and spirit of the present invention. One example is the circuit shown in FIG. 6 in which $V_h-V_T$ (instead of $V_h + V_T$) is held on a p-channel gate to generate a "mirror image" signal to prevent the bit lines from being pulled down and up as well. Thus in FIG. 6 circuit 40 is shown at the top with a further circuit 60 below. Circuit 60 is nearly a mirror image of circuit 40. Where circuit 40 includes n-channel transistors 44, 46, 48, and 50, circuit 60 includes transistors 64, 66, 68, and 70, of which transistors 68 and 70 are preferably p-channel transistors. Hold line 22 is coupled to transistors 68 and 70. Where circuit 40 includes a capacitor 52, circuit 60 includes a capacitor 72. One plate of capacitor 72 is coupled to a node 65, which is also coupled to the gate electrode of transistor 70 and to the source-drain paths of transistors 64 and 66. A voltage $V_h - V_{tp}$ develops at node 65.

Figure 6:
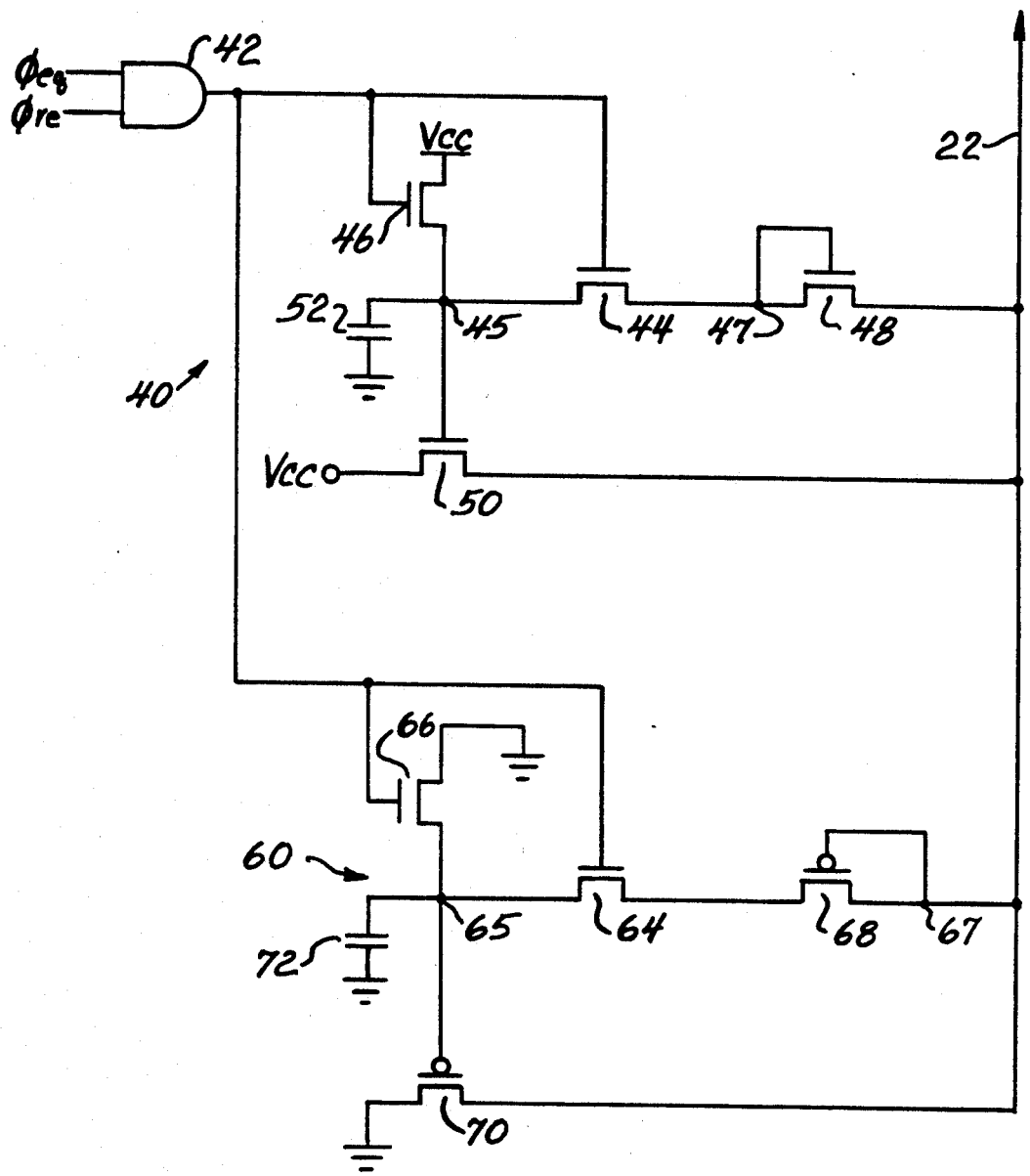
FIG. 6 shows added circuitry to clamp the bit lines at the hold voltage.

An advantage of the circuits of FIG. 4 and FIG. 6 is that the cell capacitor plate electrodes are no longer coupled to a separate ½ Vcc power supply, but instead are coupled to hold line 22. This eliminates the standby current and holds the capacitor plates to the same desirable intermediate voltage as a prior art circuit, without incurring the problems of plate bounce, an extra pin, or the like.

I claim:

1. In an integrated circuit memory having a plurality of conductor lines in a memory array, with a plurality of memory cells disposed along each of said conductor lines, and a set of sense amplifiers for the array coupled to said lines, the conductor lines being equilibrated and precharged via equilibration/precharge circuitry coupled between the bit lines and a hold line, the hold line being coupled to a holding voltage circuit, an improved holding voltage circuit for delivering a target holding voltage to the hold line, comprising:
   first circuitry for developing a first voltage related to the target holding voltage at a first node;
   storing circuitry coupled to the first node for storing the first voltage; and
   second circuitry responsively coupled to the storing circuitry for developing the target holding voltage.

2. The circuit of claim 1 wherein said first circuitry includes a logic circuit and a first transistor responsively coupled to said logic circuit.

3. The circuit of claim 2 wherein said first circuitry further includes a second transistor responsively coupled to said logic circuit.

4. The circuit of claim 2 wherein said logic circuit is coupled to receive inputs corresponding to an equilibration signal and a further signal.

5. The circuit according to claim 1 wherein said first circuitry includes a device coupled to isolate the first node from the hold line selectively.

6. The circuit according to claim 1 wherein said storing circuitry includes a capacitor.

7. The circuit according to claim 1 wherein said second circuitry includes a drive transistor responsively coupled to said storing circuitry.

8. The circuit according to claim 7 wherein said equilibration/precharge circuitry includes an equilibration/precharge transistor and wherein said drive transistor is larger than said equilibration/precharge transistor.

9. The circuit of claim 8 wherein the memory is to be cycled through a sequence of epochs including a precharge epoch and wherein said first circuitry comprises:
   first, second, and third transistors having paths of controllable conductivity selectively coupling a source of operating voltage to the hold line;
   timing circuitry providing a timing signal related to the precharge epoch;
   at least one of said first, second and third transistors being responsively coupled to said timing signal;
   said first node being associated with at least one of the first, second and third transistors, the first node being coupled to said storing circuitry and to said drive transistor;
   said second transistor being coupled selectively to isolate said first node from the hold line.

10. The circuit of claim 9 wherein said third transistor is coupled to impose a voltage drop of one transition voltage between said first node and said hold line.

11. A bit line clamp circuit for a RAM having a precharge epoch, and a hold line for receiving a hold voltage, comprising:
   a signal-providing circuit coupled to provide a signal during a portion of the precharge epoch of the RAM;
   first and second transistors coupled together at a first node, the first transistor having a path of controllable conductivity coupled to receive an operating voltage, the first and second transistors having control electrodes responsively coupled to said signal-providing circuit thereby to couple voltage via said first and second transistors to the hold line, so that a first voltage develops at said first node, said first voltage being offset from a target holding voltage;
   a drive transistor having a control electrode coupled to said first node and having a path of controllable conductivity, said drive transistor being coupled to receive said operating voltage and configured to provide a holding voltage to the hold line when said first voltage is applied to the control electrode thereof; and
   a storage capacitor coupled to said first node.

12. The circuit according to claim 11 further including a third transistor having a path of controllable conductivity coupled between said second transistor and said hold line.

13. The circuit according to claim 11 wherein said second transistor has a layout configuration tending to minimize the junction area and to maximize the ratio of the capacitance of said storage capacitor to the junction area thereby to minimize leakage from the capacitor through said second transistor.

14. The circuit according to claim 11 wherein said first transistor comprises a field effect transistor having a source-drain path coupled between a node for receiving operating voltage and said first node and having a gate electrode coupled to the output of said signal-providing circuit;
   wherein said second transistor comprises a field effect transistor having a gate electrode coupled to the output of said signal-providing circuit and having a source-drain path coupled between said first node and a second node;
   wherein said drive transistor comprises a field effect transistor having a gate electrode coupled to said first node and having a source-drain path coupled between the operating voltage and the hold line;
   said capacitor having one plate coupled to said first node;
   wherein said first and second transistors are coupled to said hold line in such fashion that said first voltage developed at said first node is offset from the target holding voltage by one transition voltage.

15. The circuit of claim 14 wherein said signal-providing circuit comprises a logic circuit.

16. A method of precharging bit lines in an integrated circuit memory to a target holding voltage, the memory having a plurality of memory cells coupled to the bit lines, comprising the steps of:
   providing a first voltage related to the target holding voltage;
   controlling the operation of an active semiconductor device with said first voltage thereby to provide therefrom a voltage equal to the target holding voltage; and
   applying said target holding voltage from said active semiconductor device to said bit lines via a path external to the memory cells.

17. The method of claim 16 wherein said providing step includes generating and storing said first voltage.

18. The method of claim 17 wherein said generating step occurs during an initial portion of a precharge epoch of the integrated circuit memory.

19. The method of claim 17 wherein said providing step comprises developing said first voltage at a first node and wherein said storing step comprises coupling said first voltage from said first node to a storage capacitor.

20. The method according to claim 19 wherein said active semiconductor device includes a drive transistor and step of controlling the operation of an active semiconductor device comprises coupling voltage from a node receiving operating voltage via said drive transistor to a hold line coupled to the bit lines, so that in response to the application of the stored voltage, said drive transistor couples a target holding voltage to said hold line.

21. The method of claim 19 wherein said generating step includes generating the related voltage at said first node in one step, and isolating the node in a subsequent step to conserve the stored voltage.

22. A method of clamping bit lines of a memory during a precharge epoch thereof to a target holding voltage comprising the steps of:
   generating a voltage offset from the target holding voltage;
   storing the offset voltage on a capacitor;
   selectively decoupling the capacitor from the bit lines;
   operating a drive device in accordance with the voltage stored on the capacitor thereby to obtain the target holding voltage; and
   coupling the target holding voltage to the bit lines during the precharge epoch.

23. The method of claim 22 wherein said generating step occurs during the precharge epoch of the memory, and comprises coupling operating voltage to the bit lines via a load having a node, and coupling the node to the capacitor.

24. In an integrated circuit memory, a voltage supply circuit for delivering a target holding voltage to a hold line comprising:
   a first circuit for developing a first voltage related to the target holding voltage at a first node;
   storing circuitry coupled to the first node for storing the first voltage; and
   a drive circuit responsively coupled to the storing means for developing the target holding voltage.

25. The circuit of claim 24 wherein said first circuit includes a logic circuit and a first transistor responsively coupled to said logic circuit.

26. The circuit of claim 25 wherein said first circuit further includes a second transistor responsively coupled to said logic circuit.

27. The circuit of claim 24 wherein said logic circuit is coupled to receive inputs corresponding to an equilibration signal and a further signal.

28. The circuit according to claim 24 wherein said first circuit includes a device coupled to isolate the first node from the hold line selectively.

29. The circuit according to claim 24 wherein said storing circuitry includes a capacitor.

30. The circuit according to claim 24 wherein said drive circuit includes a drive transistor responsively coupled to said storing circuitry.

31. The circuit according to claim 30 wherein said memory includes a plurality of bit lines and wherein said drive transistor is effective to overcome shorts in a group of said bit lines.

32. The circuit of claim 31 wherein said first circuit comprises:
   first, second, and third transistors having paths of controllable conductivity selectively coupling operating voltage to the hold line;
   a timing circuit providing a timing signal related to a precharge epoch;
   at least one of said first, second and third transistors being responsively coupled to said timing signal;
   the first node being associated with at least one of the first, second and third transistors, the first node being coupled to said storing circuitry and to said drive transistor;
   said second transistor being coupled selectively to isolate said node from the hold line.

33. The circuit of claim 32 wherein said third transistor is coupled to impose a voltage drop of one transition voltage between said first node and said hold line.

34. The supply circuit of claim 24 further comprising capacitor plate line circuitry coupling said hold line to memory cell capacitor plates in a plurality of memory cells.

35. The supply circuit of claim 34 further comprising circuitry coupling said hold line to bit lines in said memory.

36. The supply circuit of claim 24 further comprising circuitry coupling said hold line to bit lines in said memory.

37. A voltage supply circuit for a RAM having a precharge epoch, and a hold line for receiving a hold voltage, comprising:
   a signal-providing circuit coupled to provide a signal during a portion of the precharge epoch of the RAM;
   first and second transistors coupled together at a first node, the first transistor having a path of controllable conductivity coupled to receive an operating voltage, the first and second transistors having control electrodes responsively coupled to said signal providing circuit thereby to couple voltage via said first and second transistors to the hold line, so that a first voltage develops at said first node, said first voltage being offset from a target holding voltage;
   a drive transistor having a control electrode coupled to said first node and having a path of controllable conductivity, said drive transistor being coupled to receive said operating voltage and configured to provide a holding voltage to the hold line when said first voltage is applied to the control electrode thereof; and a storage capacitor coupled to said first node.

38. The circuit according to claim 37 further including a third transistor having a path of controllable conductivity coupled between said second transistor and said hold line.

39. The circuit according to claim 37 wherein said second transistor has a layout configuration tending to minimize the junction area and to maximize the ratio of the capacitance of said storage capacitor to the junction area thereby to minimize leakage from the capacitor through said second transistor.

40. The circuit according to claim 37 wherein said first transistor comprises a field effect transistor having a source-drain path coupled between a node for receiving operating voltage and said first node and having a gate electrode coupled to the output of said signal-providing circuit;

wherein said second transistor comprises a field effect transistor having a gate electrode coupled to an output of said signal providing circuit and having a source-drain path coupled between said first node and second node;

wherein said drive transistor comprises a field effect transistor having a gate electrode coupled to said first node and having a source-drain path coupled at one side to receive operating voltage and coupled at the other side to the hold line;

said capacitor having a first plate coupled to said first node;

wherein said first and second transistors are coupled to said hold line in such a manner that the voltage developed at said first node is offset from the target holding voltage by one transition voltage.

41. The circuit of claim 40 wherein said signal-providing circuit comprises a logic circuit.

42. In an integrated circuit DRAM having an array of memory cells, a bit line coupled to a plurality of memory cells within the array, each memory cell having a respective access transistor and a capacitor, a bit line clamp and precharge circuit comprising:

a capacitor plate line coupled to a plurality of the memory cell capacitors in the array; and a further transistor located within the integrated circuit but external to the memory cells, said further transistor having a path of controllable conductivity selectively coupling said bit line to said capacitor plate line.

43. The circuit of claim 42 wherein said access transistors have respective first and second terminals and a control terminal, and wherein said bit line is coupled to said first terminals of the access transistors of a plurality of memory cells along a column of the array, the capacitors have first plates coupled to said second terminals of the respective transistors, and the capacitors have second plates coupled to said capacitor plate line.

44. The circuit of claim 42 wherein said cell capacitor plate line is further coupled to a supply circuit.

45. The circuit of claim 44 wherein said supply circuit comprises:

a first circuit configured to develop a first voltage related to a target holding voltage at a first node;

a storing device coupled to the first node for storing the first voltage; and a second circuit responsively coupled to the storing device for developing the target holding voltage.

46. The supply circuit of claim 37 further comprising:

third and fourth transistors coupled together at a second node, each having respective control electrodes coupled to said signal-providing circuit;

a second storage capacitor coupled to said second node;

a second drive transistor coupled to said second node, the first-mentioned drive transistor having one channel type and the second drive transistor having the other channel type, the second drive transistor having a path of controllable conductivity coupled between said hold line and a second voltage source;

said third transistor having a path of controllable conductivity coupled between said second voltage source and said second node;

said fourth transistor having a path of controllable conductivity coupled between said second node and said hold line, whereby it may selectively isolate said second node and said second capacitor from said hold line.

47. The method of claim 16 wherein said step of applying said target voltage to said bit lines comprises said target voltage to one or more equilibration/precharge transistors coupled to the bit lines.

48. The method of claim 47 wherein said step of applying said target voltage to said bit lines comprises selectively operating said one or more equilibration/precharge transistors during a precharge/equilibration epoch.

* * * * *